US006498114B1

(12) United States Patent
Amundson et al.

(10) Patent No.: US 6,498,114 B1
(45) Date of Patent: Dec. 24, 2002

(54) METHOD FOR FORMING A PATTERNED SEMICONDUCTOR FILM

(75) Inventors: Karl Amundson, Cambridge, MA (US);
Paul S. Drzaic, Lexington, MA (US);
Jianna Wang, Waltham, MA (US);
Gregg Duthaler, Brookline, MA (US);
Peter Kazlas, Sudbury, MA (US)

(73) Assignee: E Ink Corporation, Cambridge, MA (US)

( * ) Notice: Subject to any disclaimer, the term of this patent is extended or adjusted under 35 U.S.C. 154(b) by 84 days.

(21) Appl. No.: 09/651,710

(22) Filed: Aug. 31, 2000

Related U.S. Application Data

(63) Continuation-in-part of application No. 09/621,000, filed on Jul. 21, 2000, which is a continuation-in-part of application No. 09/289,036, filed on Apr. 9, 1999.
(60) Provisional application No. 60/144,943, filed on Jul. 21, 1999, provisional application No. 60/147,989, filed on Aug. 10, 1999, provisional application No. 60/151,716, filed on Aug. 31, 1999, and provisional application No. 60/151,715, filed on Aug. 31, 1999.

(51) Int. Cl.[7] .......................... H01L 21/31; H01L 51/40; H01L 21/00
(52) U.S. Cl. ........................ 438/780; 438/99; 438/22; 438/82; 438/36; 438/455; 438/714
(58) Field of Search ...................... 438/780, 127, 438/694, 953, 738, 622, 623, 700, 99, 22, 23, 26, 36, 82, 714, 455, 106, 160, 29, 30, 35, 28

(56) References Cited

U.S. PATENT DOCUMENTS 2,800,457 A   7/1957   Green et al.

(List continued on next page.)

FOREIGN PATENT DOCUMENTS

| EP | 0 186 710 A1 | 7/1986 |
| EP | 0 204 063 | 10/1987 |
| EP | 0 240 063 B1 | 10/1987 |
| EP | 0 268 877 | 6/1988 |

(List continued on next page.)

OTHER PUBLICATIONS

Bao et al., "Soluble and processable regioregular poly(3–hexylthiophene) for thin film field–effect transistor applications with high mobility," *American Institute of Physics*, vol. 69, No. 26, Dec. 23, 1996, pp. 4108–4110.

(List continued on next page.)

*Primary Examiner*—Matthew Smith
*Assistant Examiner*—Igwe U. Anya
(74) *Attorney, Agent, or Firm*—Testa, Hurwitz & Thibeault, LLP

(57) ABSTRACT

A process for forming a pattern in a semiconductor film is provided. The process comprises the steps of: providing a substrate; providing an organic semiconductor film adjacent the substrate; and providing a destructive agent adjacent selected portions of the organic semiconductor film, the destructive agent changing a property of selected portions of the organic semiconductor film substantially through the full thickness of the organic semiconductor film such that the property of the selected portions of the organic semiconductor film differs from the property of remaining portions of the organic semiconductor film. A method for manufacturing a transistor comprises the steps of: providing a substrate; providing a gate electrode adjacent the substrate; providing a gate dielectric adjacent the substrate and the gate electrode; providing a source electrode and a drain electrode adjacent the gate dielectric; providing a mask adjacent the gate dielectric in a pattern such that the source electrode, the drain electrode, and a portion of the gate dielectric remain exposed; and providing a semiconductor layer comprising one of an organic semiconductor and a plurality of inorganic colloidal particles, adjacent the source electrode, the drain electrode, the portion of the gate dielectric and the mask, thereby forming the transistor, the semiconductor layer having a thickness less than a thickness of the mask.

26 Claims, 5 Drawing Sheets

U.S. PATENT DOCUMENTS

| | | |
|---|---|---|
| 3,036,388 A | 5/1962 | Tate |
| 3,384,488 A | 5/1968 | Tulagin et al. |
| 3,406,363 A | 10/1968 | Tate |
| 3,460,248 A | 8/1969 | Tate |
| 3,585,381 A | 6/1971 | Hodson et al. |
| 3,612,758 A | 10/1971 | Evans et al. |
| 3,668,106 A | 6/1972 | Ota |
| 3,670,323 A | 6/1972 | Sobel et al. |
| 3,756,693 A | 9/1973 | Ota |
| 3,767,392 A | 10/1973 | Ota |
| 3,772,013 A | 11/1973 | Wells |
| 3,792,308 A | 2/1974 | Ota |
| 3,806,893 A | 4/1974 | Ohnishi et al. |
| 3,850,627 A | 11/1974 | Wells et al. |
| 3,892,568 A | 7/1975 | Ota |
| 4,001,140 A | 1/1977 | Foris et al. |
| 4,041,481 A | 8/1977 | Sato |
| 4,045,327 A | 8/1977 | Noma et al. |
| 4,062,009 A | 12/1977 | Raverdy et al. |
| 4,068,927 A | 1/1978 | White |
| 4,071,430 A | 1/1978 | Liebert |
| 4,088,395 A | 5/1978 | Giglia |
| 4,093,534 A | 6/1978 | Carter et al. |
| 4,123,346 A | 10/1978 | Ploix |
| 4,126,528 A | 11/1978 | Chiang |
| 4,126,854 A | 11/1978 | Sheridon |
| 4,143,103 A | 3/1979 | Sheridon |
| 4,143,472 A | 3/1979 | Murata et al. |
| 4,147,932 A | 4/1979 | Lewis |
| 4,149,149 A | 4/1979 | Miki et al. |
| 4,166,800 A | 9/1979 | Foag |
| 4,203,106 A | 5/1980 | Dalisa et al. |
| 4,211,668 A | 7/1980 | Tate |
| 4,218,302 A | 8/1980 | Dalisa et al. |
| 4,231,641 A | 11/1980 | Randin |
| 4,261,653 A | 4/1981 | Goodrich |
| 4,272,596 A | 6/1981 | Harbour et al. |
| 4,273,672 A | 6/1981 | Vassiliades |
| 4,298,448 A | 11/1981 | Müller et al. |
| 4,305,807 A | 12/1981 | Somlyody |
| 4,311,361 A | 1/1982 | Somlyody |
| 4,314,013 A | 2/1982 | Chang |
| 4,324,456 A | 4/1982 | Dalisa |
| 4,368,952 A | 1/1983 | Murata et al. |
| 4,390,403 A | 6/1983 | Batchelder |
| 4,418,346 A | 11/1983 | Batchelder |
| 4,419,383 A | 12/1983 | Lee |
| 4,438,160 A | 3/1984 | Ishikawa |
| 4,450,440 A | 5/1984 | White |
| 4,502,934 A | 3/1985 | Gazard et al. |
| 4,522,472 A | 6/1985 | Liebert et al. |
| 4,543,306 A | 9/1985 | Dubois et al. |
| 4,620,916 A | 11/1986 | Zwemer et al. |
| 4,643,528 A | 2/1987 | Bell, Jr. |
| 4,648,956 A | 3/1987 | Marshall et al. |
| 4,655,897 A | 4/1987 | DiSanto et al. |
| 4,707,080 A | 11/1987 | Fergason |
| 4,732,830 A | 3/1988 | DiSanto et al. |
| 4,742,345 A | 5/1988 | DiSanto et al. |
| 4,746,917 A | 5/1988 | DiSanto et al. |
| 4,748,366 A | 5/1988 | Taylor |
| 4,833,464 A | 5/1989 | DiSanto et al. |
| 4,846,931 A | 7/1989 | Gmitter et al. |
| 4,883,561 A | 11/1989 | Gmitter et al. |
| 4,889,603 A | 12/1989 | DiSanto et al. |
| 4,909,959 A | 3/1990 | Lemaire et al. |
| 4,919,521 A | 4/1990 | Tada et al. |
| 4,931,019 A | 6/1990 | Park |
| 4,947,219 A | 8/1990 | Boehm |
| 5,017,225 A | 5/1991 | Nakanishi et al. |
| 5,041,824 A | 8/1991 | DiSanto et al. |
| 5,053,763 A | 10/1991 | DiSanto et al. |
| 5,057,363 A | 10/1991 | Nakanishi |
| 5,059,694 A | 10/1991 | Delabouglise et al. |
| 5,066,105 A | 11/1991 | Yoshimoto et al. |
| 5,066,559 A | 11/1991 | Elmasry et al. |
| 5,066,946 A | 11/1991 | DiSanto et al. |
| 5,070,326 A | 12/1991 | Yoshimoto et al. |
| 5,077,157 A | 12/1991 | DiSanto et al. |
| 5,082,351 A | 1/1992 | Fergason |
| 5,105,185 A | 4/1992 | Nakanowatari et al. |
| 5,128,785 A | 7/1992 | Yoshimoto et al. |
| 5,132,049 A | 7/1992 | Garreau et al. |
| 5,138,472 A | 8/1992 | Jones et al. |
| 5,149,826 A | 9/1992 | Delabouglise et al. |
| 5,151,032 A | 9/1992 | Igawa |
| 5,174,882 A | 12/1992 | DiSanto et al. |
| 5,177,476 A | 1/1993 | DiSanto et al. |
| 5,185,226 A | 2/1993 | Grosso et al. |
| 5,187,609 A | 2/1993 | DiSanto et al. |
| 5,204,424 A | 4/1993 | Roncali et al. |
| 5,208,066 A * | 5/1993 | Fujisaki et al. ............... 427/96 |
| 5,216,416 A | 6/1993 | DiSanto et al. |
| 5,223,115 A | 6/1993 | DiSanto et al. |
| 5,223,823 A | 6/1993 | DiSanto et al. |
| 5,247,290 A | 9/1993 | DiSanto et al. |
| 5,250,388 A | 10/1993 | Schoch, Jr. et al. |
| 5,250,932 A | 10/1993 | Yoshimoto et al. |
| 5,250,938 A | 10/1993 | DiSanto et al. |
| 5,254,981 A | 10/1993 | DiSanto et al. |
| 5,262,098 A | 11/1993 | Crowley et al. |
| 5,266,937 A | 11/1993 | DiSanto et al. |
| 5,268,448 A | 12/1993 | Buechner et al. |
| 5,270,843 A | 12/1993 | Wang |
| 5,276,438 A | 1/1994 | DiSanto et al. |
| 5,279,511 A | 1/1994 | DiSanto et al. |
| 5,279,694 A | 1/1994 | DiSanto et al. |
| 5,293,528 A | 3/1994 | DiSanto et al. |
| 5,296,974 A | 3/1994 | Tada et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | DiSanto et al. |
| 5,315,312 A | 5/1994 | DiSanto et al. |
| 5,316,341 A | 5/1994 | Scwartz |
| 5,344,594 A | 9/1994 | Sheridon |
| 5,347,144 A | 9/1994 | Garnier et al. |
| 5,359,346 A | 10/1994 | DiSanto et al. |
| 5,360,689 A | 11/1994 | Hou et al. |
| 5,362,671 A | 11/1994 | Zavracky et al. |
| 5,380,362 A | 1/1995 | Schubert |
| 5,383,008 A | 1/1995 | Sheridon |
| 5,389,945 A | 2/1995 | Sheridon |
| 5,402,145 A | 3/1995 | DiSanto et al. |
| 5,403,515 A | 4/1995 | Instone et al. |
| 5,411,398 A | 5/1995 | Nakanishi et al. |
| 5,411,656 A | 5/1995 | Schubert |
| 5,421,926 A | 6/1995 | Yukinobu et al. |
| 5,460,688 A | 10/1995 | DiSanto et al. |
| 5,463,492 A | 10/1995 | Check, III |
| 5,467,107 A | 11/1995 | DiSanto et al. |
| 5,498,674 A | 3/1996 | Hou et al. |
| 5,508,068 A | 4/1996 | Nakano |
| 5,512,162 A | 4/1996 | Sachs et al. |
| 5,543,219 A | 8/1996 | Elwakil |

| | | |
|---|---|---|
| 5,552,679 A | 9/1996 | Murasko |
| 5,556,583 A | 9/1996 | Tashiro et al. |
| 5,561,443 A | 10/1996 | DiSanto et al. |
| 5,565,885 A | 10/1996 | Tamanoi |
| 5,573,711 A | 11/1996 | Hou et al. |
| 5,574,291 A | 11/1996 | Dodabalapur et al. |
| 5,582,700 A | 12/1996 | Bryning et al. |
| 5,583,675 A | 12/1996 | Yamada et al. |
| 5,596,208 A | 1/1997 | Dodabalapur et al. |
| 5,597,889 A | 1/1997 | Takimoto et al. |
| 5,604,027 A | 2/1997 | Sheridon |
| 5,604,070 A | 2/1997 | Rao et al. |
| 5,610,455 A | 3/1997 | Allen et al. |
| 5,614,340 A | 3/1997 | Bugner et al. |
| 5,625,199 A | 4/1997 | Baumbach et al. |
| 5,627,561 A | 5/1997 | Laspina et al. |
| 5,635,317 A | 6/1997 | Taniguchi et al. |
| 5,638,103 A | 6/1997 | Obata et al. |
| 5,639,914 A | 6/1997 | Tomiyama et al. |
| 5,643,673 A | 7/1997 | Hou |
| 5,650,872 A | 7/1997 | Saxe et al. |
| 5,654,367 A | 8/1997 | Takimoto et al. |
| 5,659,181 A | 8/1997 | Bridenbaugh et al. |
| 5,663,224 A | 9/1997 | Emmons et al. |
| 5,672,381 A | 9/1997 | Rajan |
| 5,673,148 A | 9/1997 | Morris et al. |
| 5,676,884 A | 10/1997 | Tiers et al. |
| 5,691,098 A | 11/1997 | Busman et al. |
| 5,693,442 A | 12/1997 | Weiss et al. |
| 5,693,977 A | 12/1997 | Haddon et al. |
| 5,694,224 A | 12/1997 | Tai |
| 5,705,826 A | 1/1998 | Aratani et al. |
| 5,707,738 A | 1/1998 | Hou |
| 5,707,747 A | 1/1998 | Tomiyama et al. |
| 5,708,525 A | 1/1998 | Sheridon |
| 5,709,976 A | 1/1998 | Malhotra |
| 5,714,270 A | 2/1998 | Malhotra et al. |
| 5,715,511 A | 2/1998 | Aslam et al. |
| 5,716,550 A | 2/1998 | Gardner et al. |
| 5,717,283 A | 2/1998 | Biegelsen et al. |
| 5,717,514 A | 2/1998 | Sheridon |
| 5,717,515 A | 2/1998 | Sheridon |
| 5,725,935 A | 3/1998 | Rajan |
| 5,729,632 A | 3/1998 | Tai |
| 5,737,115 A | 4/1998 | Mackinlay et al. |
| 5,739,801 A | 4/1998 | Sheridon |
| 5,745,094 A | 4/1998 | Gordon, II et al. |
| 5,751,268 A | 5/1998 | Sheridon |
| 5,753,763 A | 5/1998 | Rao et al. |
| 5,754,332 A | 5/1998 | Crowley |
| 5,759,671 A | 6/1998 | Tanaka et al. |
| 5,760,761 A | 6/1998 | Sheridon |
| 5,767,826 A | 6/1998 | Sheridon et al. |
| 5,777,782 A | 7/1998 | Sheridon |
| 5,783,614 A | 7/1998 | Chen et al. |
| 5,808,783 A | 9/1998 | Crowley |
| 5,825,529 A | 10/1998 | Crowley |
| 5,828,432 A | 10/1998 | Shashidhar et al. |
| 5,843,259 A | 12/1998 | Narang et al. |
| 5,900,858 A | 5/1999 | Richley |
| 5,914,806 A | 6/1999 | Gordon, II et al. |
| 5,930,026 A | 7/1999 | Jacobson et al. |
| 5,936,259 A * | 8/1999 | Katz et al. ............ 438/99 |
| 5,969,376 A | 10/1999 | Bao |
| 6,265,243 B1 * | 7/2001 | Katz et al. ............ 438/99 |

FOREIGN PATENT DOCUMENTS

| | | |
|---|---|---|
| EP | 0 281 204 A2 | 9/1988 |
| EP | 0 323 656 | 7/1989 |
| EP | 0 325 013 B1 | 7/1989 |
| EP | 0 325 013 A1 | 7/1989 |
| EP | 0 361 420 A2 | 4/1990 |
| EP | 0 362 928 | 4/1990 |
| EP | 0 375 005 | 6/1990 |
| EP | 0 396 937 | 11/1990 |
| EP | 0 404 545 | 12/1990 |
| EP | 0 408 105 | 1/1991 |
| EP | 0 442 123 A1 | 8/1991 |
| EP | 0 442 123 | 8/1991 |
| EP | 0 443 571 A2 | 8/1991 |
| EP | 0 460 747 A2 | 12/1991 |
| EP | 0 525 852 | 2/1993 |
| EP | 0 537 240 | 4/1993 |
| EP | 0 540 281 A2 | 5/1993 |
| EP | 0 417 362 | 5/1995 |
| EP | 0 721 176 | 7/1996 |
| EP | 0 825 657 | 2/1998 |
| EP | 0 852 403 | 7/1998 |
| EP | 0 863 557 A2 | 9/1998 |
| EP | 0 930 641 A2 | 7/1999 |
| FR | 2 693 005 | 12/1993 |
| GB | 1 314 906 | 4/1973 |
| GB | 1 465 701 | 3/1977 |
| GB | 2 044 508 | 10/1980 |
| GB | 2 306 229 | 4/1997 |
| GB | 2 330 451 A | 4/1999 |
| JP | 53-73098 | 6/1978 |
| JP | 55096922 | 7/1980 |
| JP | 60189731 | 9/1985 |
| JP | 62058222 | 3/1987 |
| JP | 62231930 | 10/1987 |
| JP | 62269124 | 11/1987 |
| JP | 62299824 | 12/1987 |
| JP | 0186116 | 3/1989 |
| JP | 01086116 | 3/1989 |
| JP | 01086117 A | 3/1989 |
| JP | 01086118 | 3/1989 |
| JP | 64-86116 | 3/1989 |
| JP | 01142537 A | 6/1989 |
| JP | 01177517 | 7/1989 |
| JP | 01248182 A | 10/1989 |
| JP | 01267525 | 10/1989 |
| JP | 02223934 A | 9/1990 |
| JP | 02223935 A | 9/1990 |
| JP | 02223936 A | 9/1990 |
| JP | 02284124 A | 11/1990 |
| JP | 02284125 A | 11/1990 |
| JP | 5-61421 | 3/1993 |
| JP | 05165064 A | 6/1993 |
| JP | 05173194 A | 7/1993 |
| JP | 05307197 A | 11/1993 |
| JP | 6089081 | 3/1994 |
| JP | 6-202168 | 7/1994 |
| JP | 9-6277 | 1/1997 |
| JP | 950181574 | 2/1997 |
| JP | 9-185087 | 7/1997 |
| JP | 09230391 | 9/1997 |
| JP | 10-48673 | 2/1998 |
| JP | 10072571 A | 3/1998 |
| JP | 10135481 | 5/1998 |
| JP | 10142628 | 5/1998 |
| JP | 10-149118 | 6/1998 |
| JP | 10-161116 | 6/1998 |
| JP | 1019001 | 7/1998 |
| JP | 11195790 A | 7/1999 |
| WO | WO 82/02961 | 9/1982 |
| WO | WO 90/08402 | 7/1990 |
| WO | WO 92/12453 | 7/1992 |
| WO | WO 92/17873 | 10/1992 |
| WO | WO 92/20060 | 11/1992 |
| WO | WO 93/18428 | 9/1993 |
| WO | WO 94/24236 | 10/1994 |

| | | |
|---|---|---|
| WO | WO 95/02636 | 1/1995 |
| WO | WO 95/05622 | 2/1995 |
| WO | WO 95/15363 | 6/1995 |
| WO | WO 95/19227 | 7/1995 |
| WO | WO 95/27924 | 10/1995 |
| WO | WO 95/33085 | 12/1995 |
| WO | WO 96/17102 | 6/1996 |
| WO | WO 96/41372 | 12/1996 |
| WO | WO 97/04398 | 2/1997 |
| WO | WO 97/35298 | 9/1997 |
| WO | WO 97/49125 | 12/1997 |
| WO | WO 98/03896 | 1/1998 |
| WO | WO 98/12585 | 3/1998 |
| WO | WO 98/19208 | 5/1998 |
| WO | WO 98/41898 | 9/1998 |
| WO | WO 98/41899 | 9/1998 |
| WO | WO 98/55897 | 12/1998 |
| WO | WO 98/58383 | 12/1998 |
| WO | WO 99/10939 | 3/1999 |
| WO | WO 99/12170 | 3/1999 |
| WO | WO 99/14762 | 3/1999 |
| WO | WO 99/14763 | 3/1999 |
| WO | WO 99/26419 | 5/1999 |
| WO | WO 99/04631 | 8/1999 |
| WO | WO 99/40631 | 8/1999 |
| WO | WO 99/45416 | 9/1999 |
| WO | WO 99/45582 | 9/1999 |
| WO | WO 99/63527 | 12/1999 |
| WO | WO 99/65011 | 12/1999 |
| WO | WO 99/65012 | 12/1999 |

OTHER PUBLICATIONS

Bao et al., "High–Performance Plastic Transistors Fabricated by Printing Techniques," *Chemical Matter*, vol. 9, 1997, pp. 1299–1301.

Dodabalapur et al., "Organic Smart Pixels," *American Institute of Physics*, 1998, pp. 142–144.

Torsi et al., "Organic Thin–Film–Transistors With High On/Off Ratios," *Materials Research Society Symposium Proceeding*, vol. 377, 1995, pp. 895–700.

Horowitz, "Organic Field–Effect Transistors," *Advanced Materials*, vol. 10, No. 5, 1998, pp. 365–377.

McCullough, "The Chemistry of Conducting Polythiophenens," *Advanced Materials*, vol. 10, No. 2, 1998, pp. 93–116.

Kenward, "Displaying a Winning Glow," *Technology Review*, Jan./Feb. 1999, pp. 69–73.

Clarisse et al., "Field Effect Transistor with Diphthalocyanine Thin Film," *Electronics Letters*, vol. 24, No. 11, May 1988, pp. 674–675.

Comiskey et al., "Late–News Paper Electrophoretic Ink: A Printable Display Material," *SID 97 Digest*, May 13, 1997, pp. 75.

Dobson, "Electronic Book is a Whole Library," *The Sunday Times*, Feb. 25, 1996.

Zollinger, "Structures of Simple Di–and Triarylmethine Dyes," *Color Chemistry: Syntheses, Properties and Applications of Organic Dyes and Pigments*, $2^{nd}$ Revised Edition, 1991, p. 73.

M.H. Gutcho, "Pigments and Paints," *Microcapsules and Microencapsulation Techniques*, 1976, pp. 178–193.

Bohnke et al., "Polymer–Based Solid Electrochromic Cell for Matrix–Addressable Display Devices," *J. Electrochem. Soc.*, vol. 138, No. 121, Dec. 1991, pp. 3612–3617.

Murau, "Characteristics of an X–Y Addressed Electrophoretic Image Display (EPID)," *SID 84 Digest*, 1984, pp. 141.

Garnier et al., "All–Polymer Field–Effect Transistor Realized by Printing Techniques," Sep. 16, 1994, vol. 265, pp. 1684–1686.

Lu et al., "Studies of Polymer–Based Field Effect Transistors," Sep. 1993, vol. 2, pp. 814–816.

Masui et al., "Effect of Crystallinity on Electrical Conductivity of Alpha CU–Phthalocyanin Film," May 1, 1992, vol. 112A, No. 5, pp. 371–374.

Nakamura et al., "Development of Electrophoretic Display Using Microencapsulated Suspension," *1998 ISD International Symposium Disgust of Technical Papers. vol. 29, Proceedings of Sid'98 International Symposium*, Anaheim, CA, USA, May 1998, pp. 1014–1017.

Sankus, "Electrophoretic Display Cell," *Xerox Disclosure Journal*, vol. 4, No. 3, May/Jun. 1979, pp. 309.

"Microencapsulation with Synthetic Polymeric Film Formers," *Microcapsules and Microencapsulation Techniques*, 1976, pp. 65–130.

Ballinger et al., "Magnetic Recording Paper is Erasable," *Electronics*, Mar. 1, 1973, pp. 73–76.

Beilin et al, "2000–Character Electrophoretic Display," *SID 86 Digest*, 1986, pp. 136–140.

Chiang, "Conduction Mechanism of Charge Control Agents Used in Electrophoretic Display Devices," *Proceeding of the SID 18*, vol. 18, Nos. 3 & 4, 1977, pp. 275–282.

Clarisse, "A High Speed Electrophoretic Matrix Display," *SID 80 Digest*, 1980, pp. 114–115.

Dalisa, "Electrophoretic Display Technology," *Transactions on Electron Devices*, vol. 24, No. 7, Jul. 1977, pp. 827–834.

Egashira et al., "A Solid Electrochromic Cell Consisting of Lu–Diphthaocyanine and Lead Fluoride," *Proceeding of the SID*, vol. 28, No. 3, 1987, pp. 227–232.

Fitzhenry, "Optical Effects of Adsorption of dyes on Pigment Used in Electrophoretic Image Displays," *Applied Optics*, vol. 18, No. 19, Oct. 1979, pp. 3332–3337.

Fitzhenry–Ritz, "Optical Properties of Electrophoretic Image Displays," *Proceeding of the SID*, vol. 22, No. 4, 1981, pp. 300–309.

Goodman, "Passive Liquid Displays: Liquid Crystal, Electrophoretics, and Electrochromics," *Proceeding of the SID*, vol. 17, No. 1, 1976, pp. 30–38.

Gutcho, "Additional Uses of Encapsulated Products," *Microcapsules and Microencapsulation Techniques*, 1976, pp. 279–343.

Hatano et al., (1996), "Bistable Paper–White Display Device Using Cholesteric Liquid Crystals", *SID 96 Digest*, 1996, pp. 269–272.

Jin et al., "Optically Transparent, Electrically Conductive Composite Medium," *Science*, vol. 255, Jan. 24, 1992, pp. 446–448.

Lewis et al., "Gravitational, Inter–Particle and Particle–Electrode Forces in the Electrophoretic Display," *Proceeding of the SID*, vol. 18, Nos. 3 & 4, 1977, pp. 235–242.

Mürau et al., "The Understanding and Elimination of Some Suspension Instabilities in an Electrophoretic Display," *Journal of Applied Physics*, vol. 49, No. 9, 1978, pp. 4820–4829.

Vaz et al., "Dual Frequency Addressing of Polymer–Dispensed Liquid–Crystal Films," *Journal of Applied Physics*, vol. 65, No. 12, Jun. 15, 1989, pp. 5043–5049.

Ota et al., "Developments in Electrophoretic Displays," *Proceedings of the SID*, vol. 18, Nos. 3 & 4, 1977, pp. 243–254.

Ota et al., "Electrophoretic Image Display (EPID) Panel," *Proceedings of the IEEE*, 1973, pp. 1–5.

Ota et al., "Electrophoretic Display Devices," *Laser 75 Optoelectronics Conference Proceedings*, pp. 145–148.

Pearlstein, "Electroless Plating," *Modern Electroplating*, pp. 710–747.

Sheridon et al., "The Gyricon–A Twisting Ball Display," *Proceeding of the SID*, 1977, vol. 18, Nos. 3 and 4, pp. 289–293.

Shiwa. S. et al., "Electrophoretic Display Method Using Ionographic Technology," *SID 88 Digest*, 1988, pp. 61–62.

Singer et al., "An X–Y Addressable Electrophoretic Display," *Proceeding of the SID*, vol. 18, Nos. 3 & 4, 1977, pp. 255–266.

Yang et al., "A New Architecture for Polymer Transistors," *Nature*, vol. 372, Nov. 24, 1994, pp. 344–346.

Flaherty, "What Did Disappearing Ink Grow Up to Be? Electronic Ink," *The New York Times*, May 6, 1999.

Negroponte et al., "Surfaces and Displays," *Wired*, Jan. 1997, pp. 212.

Comiskey et al, "An Electrophoretic Ink for All–Printed Reflective Electronic Displays," *Nature*, vol. 394, Jul. 16, 1998, pp. 253–255.

Zurer, "Digital Ink Brings Electronic Books Closer," *Chemical*, Jul. 20, 1998, pp. 12–13.

Peterson, "Rethinking Ink. Printing the Pages of an Electronic Book," *Science News*, vol. 153, Jun. 20, 1998, pp. 396–397.

Guernsey, "Beyond Neon: Electronic Ink," *New York Times*, Jun. 3, 1999, pp. 11.

White, "An Electrophoretic Bar Graph Display," *Proceedings of the SID*, vol. 22, No. 3, 1981, pp. 173–180.

Pansu et al., "Structures of Thin Layers of Hard Spheres: High Pressure Limit," *J. Physique*, vol. 45, Feb. 1984, pp. 331–339.

Peiranski et al., Thin Colloidal Crystals, *Physical Review Letters*, vol. 50, Nos. 12, Mar. 21, 1983, pp. 900–903.

Pansu et al., "Thin Colloidal Crystals: A Series of Structural Transitions," *J. Physique*, vol. 44, Apr. 1983, pp. 531–536.

Van Winkle et al., "Layering Transitions in Colloidal Crystals as Observed by Diffraction and Direct–Lattice Imaging," *Physical Review*, vol. 34, No. 1, Jul. 1986, pp. 562–573.

Mürau et al., "An Electrophoretic Radiographic Device," *SID 79 Digest*, 1979, pp. 46–47.

Blazo, S.F. "High Resolution Electrophoretic Display with Photoconductor Addressing" *SID 82 Digest*, 1982, pp. 92–93.

Bryce, "Seeing Through Synthetic Metals," *Nature*, vol. 335, No. 6185, Sep. 1, 1988, pp. 12–13.

Croucher et al., "Electrophoretic Display: Materials as Related to Performance," *Photographic Science and Engineering*, vol. 25, No. 2, 1981, pp. 80–86.

Ji et al, "P–50: Polymer Walls in Higher–Polymer–Content Bistable Reflective Cholesteric Displays," *SID 96 Digest*, 1996, pp. 611–613.

Lee, "Fabrication of Magnetic Particles Display," *Proceeding of the S.I.D.*, vol. 18, Nos. 3 & 4, 1977, pp. 283–288.

Pankove, "Color Reflection Type Display Panel," *RCA Technical Notes*, No. 535: Mar. 1962, pp. 1–2.

Saitoh, M. et al., "A Newly Developed Electrical Twisting Ball Display," *Proceedings of the SID*, vol. 23, No. 4, 1982, pp. 249–253.

Sheridon et al., "The Gyricon–A Twisting Ball Display," *Proceeding of the SID*, vol. 18, Nos. 3 and 4, 1977, pp. 289–293.

Shiffman et al., "An Electrophoretic Image Display with Internal NMOS Address Logic and Display Drivers," *Proceedings of the SID*, vol. 25, No. 2, 1984, pp. 105–115.

Vance, "Optical Characteristics of Electrophoretic Displays," *Proceeding of the SID*, vol. 18, Nos. 3 and 4, 1977, 267–274.

Yamaguchi et al., "Equivalent Circuit of Ion Projection–Driven Electrophoretic Display," *IEICE Transaction*, vol. 74, No. 12, 1991, pp. 4152–4156.

"Electronic Ink' Sign Debuts as JC Penney," *Boston Globe*, May 4, 1999.

Drzaic, P. et al., "A Printed and Rollable Bistable Electronic Display," SID International Symposium Digest of Technical Papers, vol. 29, May 17, 1998.

Toyama, J. et al., "An Electrophoretic Matrix Display with External Logic and Driver Directly Assembled to the Panel," SID International Symposium Digest of Technical Papers, vol. 25, Jun. 14, 1994.

Jackson, T. et al., "Organic Thin–Film Transistors for Organic Light–Emitting Flat–Panel Display Backplanes," IEEE Journal of Selected Topics in Quantum Electronics, vol. 4, No. 1, Jan. 1, 1998.

Sano, "Block Copolymer Epitaxy," *Advanced Materials*, 1997.

Wong et al., "Patterning of poly(3–alkylthiophene) thin films by direct–write ultraviolet laser lithography," *Materials Science and Engineering*, 1998.

Hebner, T.R. et al., "Ink–Jet Printing of Doped Polymers for Organic Light Emitting Devices," American Institute of Physics, Applied Physics Letters, vol. 72, No. 5, Feb. 2, 1998, pp. 519–521.

Bonse et al., "Integrated a–Si:H/Pentacene Inorganic/Organic Complementary Circuits," International Electron Devices Meeting, San Francisco, California, Dec. 6–9, 1998, *IEDM Technical Digest*, 1998, pp. 248–252.

\* cited by examiner

METHOD FOR FORMING A PATTERNED SEMICONDUCTOR FILM

RELATED APPLICATIONS

This application is a continuation in part of U.S. Ser. No. 09/621,000 filed on Jul. 21, 2000 which is a continuation in part of U.S. Ser. No. 09/289,036 filed on Apr. 9, 1999 and which claimed benefit of provisional applications U.S. Ser. No. 60/144,943 filed on Jul. 21, 1999 and U.S. Ser. No. 60/147,989 filed on Aug. 10, 1999, and claims benefit of provisional applications 60/151,716 filed on Aug. 31, 1999 and U.S. Ser. No. 60/151,715 filed on Aug. 31, 1999. The entire contents of all the aforementioned applications are incorporated herein by reference.

TECHNICAL FIELD

The invention relates generally to manufacturing of semiconductor devices and more particularly to the patterning of semiconductor films in the manufacture of arrays of transistors for use in display devices.

BACKGROUND OF THE INVENTION

The fabrication of all-printed backplanes on polymeric substrates through use of solvent-based inks offers the potential for lower cost, flexible, or large area displays. There are numerous potential applications for such displays, such as rolled displays, affordable large area displays, displays incorporated into fabrics, and as a paper substitute. Unfortunately, many problems remain in the development of thin-film transistor ("TFT") arrays used for addressing in such displays.

Organic semiconductor materials or dispersions of inorganic semiconducting particles lend themselves to relatively simple and inexpensive deposition methods. Possible methods include thermal evaporation in a vacuum chamber or wet processing such as spin coating using an appropriate solvent or by other coating techniques known to yield thin films.

Some deposition techniques have the advantage of forming thin films of organic semiconductor that have desirable properties such as a high field effect mobility for the dominant charge carrier in the film. For example, it is known that vacuum deposition of oligothiophenes such as α-sexithiophene, or α, ω-dihexyl quaterthiophene under proper processing conditions, gives films that exhibit a high field effect mobility.

Unfortunately, wet deposition processes do not readily permit patterning of the film because the wet material is generally distributed over the entire substrate. Vacuum deposition can be done in a patterned way using, for example, of a contact mask. Fine details, however, are difficult to pattern because of resolution limits of contact masks for vacuum deposition. Well established silicon-based device patterning methods, such as photolithography, are relatively complex and expensive. Such patterning methods conflict with the desire to manufacture relatively inexpensive arrays of transistors.

What are needed are relatively simple, low cost manufacturing methods for production of patterned semiconductor films to help realize the advantages of large array and flexible displays.

SUMMARY OF THE INVENTION

The present invention provides a method to pattern semiconductor layers, in particular for use in the manufacture of lower cost, larger area transistor arrays. Use of lower cost deposition methods, such as printing techniques, enables realization of the benefits of large area displays, in particular displays employing an encapsulated electrophoretic display medium.

One embodiment of a process for forming a patterned semiconductor film comprises providing a substrate and an organic semiconductor film adjacent to the substrate. A destructive agent is deposited adjacent to selected portions of the organic semiconductor film where the destructive agent is chosen to change a property of selected portions of the organic semiconductor film substantially through the full thickness of the organic semiconductor film.

The destructive agent can comprise a solvent that serves to dissolve neighboring portions of the organic semiconductor layer. Other materials can be employed to cause gross damage to portions of the semiconductor layer, such as an oxidizer to cause oxidation of the neighboring portions of the semiconductor layer.

Alternatively, a portion of the destructive agent can diffuse into neighboring portions of the organic semiconductor film and impair the electrical properties of those portions of the film. Damaged portions of the organic semiconductor film preferably have reduced conductivity and may act as an insulator. These portions provide electrical isolation between neighboring transistors in an array.

The destructive agent can further comprise a gelling agent. The gelling agent assists, for example, in deposition of the destructive agent via printing methods.

In another embodiment, a method for manufacturing a transistor comprises the provision of a substrate and a gate electrode adjacent to the substrate. A gate dielectric is deposited adjacent to the substrate and the gate electrode. Source and drain electrodes are deposited adjacent to the gate dielectric. A mask is deposited adjacent to the gate dielectric in a pattern such that the source electrode, the drain electrode, and a portion of the gate dielectric remain exposed and a semiconductor layer comprising one of an organic semiconductor and a plurality of inorganic colloidal particles is deposited adjacent to the source electrode, the drain electrode, the portion of the gate dielectric and the mask, thereby forming the transistor, the semiconductor layer having a thickness less than a thickness of the mask. In some embodiments, the thickness of the semiconductor layer is 1/50 to 1/1000 of the thickness of the mask.

In some bottom contact transistor embodiments, the mask need not be removed since it can disrupt the continuity of the semiconductor layer between neighboring transistors. The mask further leads to an effective increase in the spacing between neighboring transistors. These effects can reduce leakage currents between transistors.

The invention can assist all-printed fabrication of display devices. Patterning of the semiconductor layer can be accomplished through use of techniques such as silk screening or stamping. The invention has particular application in the fabrication of large area, flexible lower cost displays that incorporate a microencapsulated electrophoretic display medium.

BRIEF DESCRIPTION OF THE DRAWING

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

DETAILED DESCRIPTION OF THE INVENTION

The present invention relates generally to a method to pattern semiconductor layers, in particular for use in the manufacture of lower cost, large area transistor arrays. The invention is of particular use in the production of displays with a microencapsulated electrophoretic display medium and mitigates the problem of patterning semiconductor films to reduce leakage currents between neighboring TFT's, in particular those comprising an organic semiconductor film.

Figure 1:
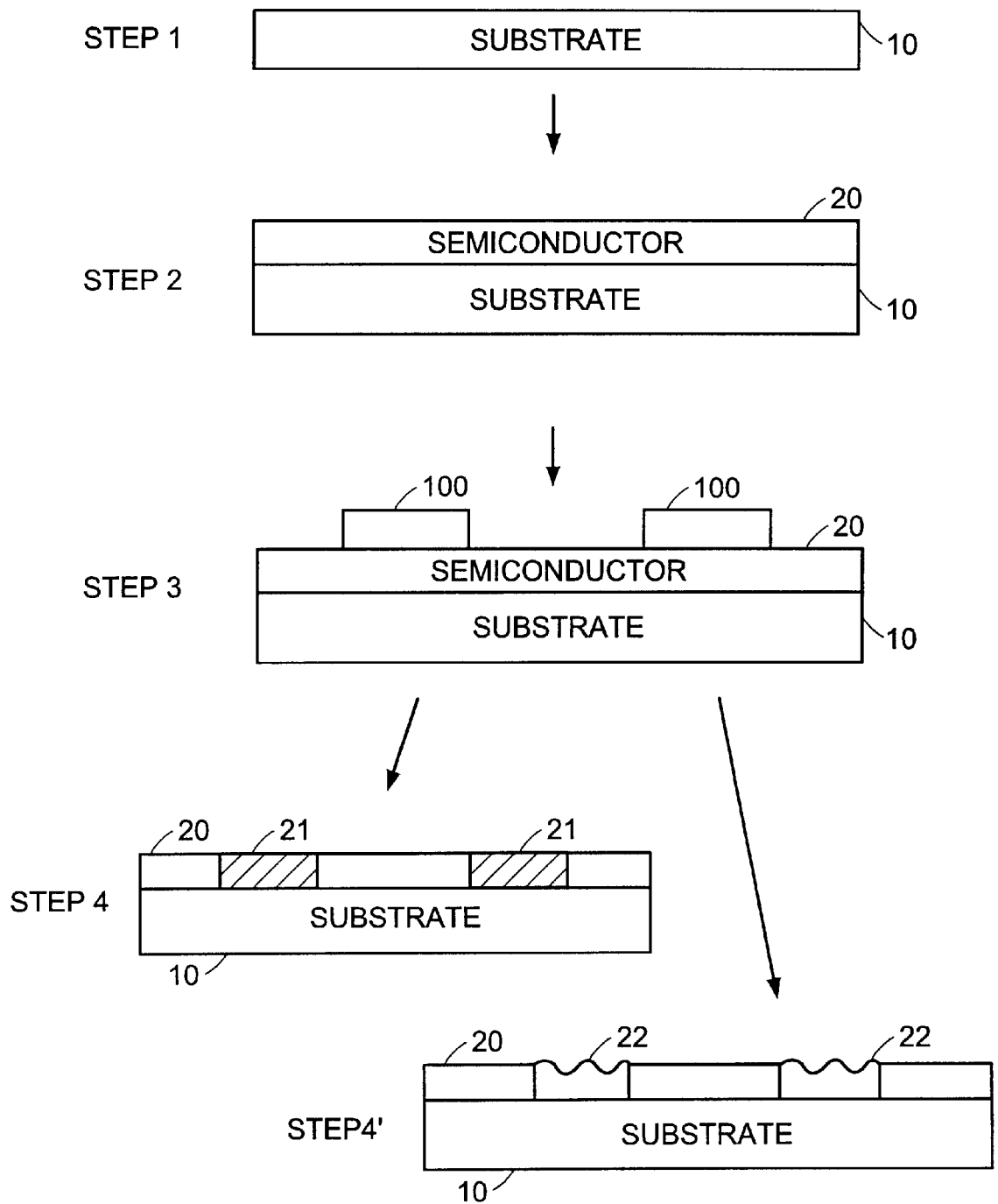
FIG. 1 shows cross-sectional views of an embodiment of an electronic device at various stages of fabrication.

Patterning by Altering a Property of an Organic Semiconductor Film via a Destructive Agent Referring to FIG. 1, two embodiments of a method of patterning an organic semiconductor film 20 are depicted. A substrate 10 is provided (Step 1), comprised of, for example, a silicon wafer, a polyimide sheet or other polymer sheet. The organic semiconductor film 20 is deposited on the substrate 10 (Step 2). The film 20 comprises, for example, poly(alkyl thiophene), or precursors of pentacene and polythienylenevinylene (PTV), which can be converted into pentacene and PTV semiconductor at elevated temperature. Next, a patterned layer of a destructive agent 100 is deposited adjacent to the organic semiconductor film 20 (Step 3).

The destructive agent 100 is selected for its ability to change a property of the organic semiconductor film 20. Sufficient quantity of the destructive agent 100 is applied so that adjacent portions of the organic semiconductor film 20 have the property changed substantially through the full thickness of the film 20. The property changed can be a chemical, physical or other property that can have an effect on the electrical properties of the organic semiconductor film 20.

For example, PTV precursor contains a small amount of hydrochloric acid (HCl) as a catalyst during conversion to PTV semiconductor. Therefore, alkaline compounds such as ammonia can be used as the destructive agent. The ammonia concentration can be 2–10 times of that of HCl in the PTV precursor film.

In preferred embodiments, an electrical property of the organic semiconductor film 20 is the changed property. The destructive agent 100 diminishes, for example, the conductivity of the organic semiconductor film 20 in portions that are adjacent to the destructive agent 100. This provides for reduced leakage currents between unaffected portions of the organic semiconductor film 20 which can be used for fabrication of organic TFT's ("OTFT").

Numerous materials can used for the destructive agent 100. The destructive agent can be chosen to diffuse into the adjacent organic semiconductor film 20 and damage the electrical properties of the organic semiconductor film 20, leaving portions of damaged material 21 of diminished conductivity (Step 4).

Other destructive agents 100 are chosen for their ability to cause gross morphological changes to the adjacent organic semiconductor film 20. For example, the destructive agent can comprise chloroform, toluene, or xylene if the organic semiconductor film 20 comprises poly(alkylthiophene). In this case, adjacent organic semiconductor film 20 material dissolves and redeposits as the solvent dries (Step 4'). This leaves damaged material 22 that has undergone gross morphological changes, typically behaving now as an insulator.

Figure 2A:
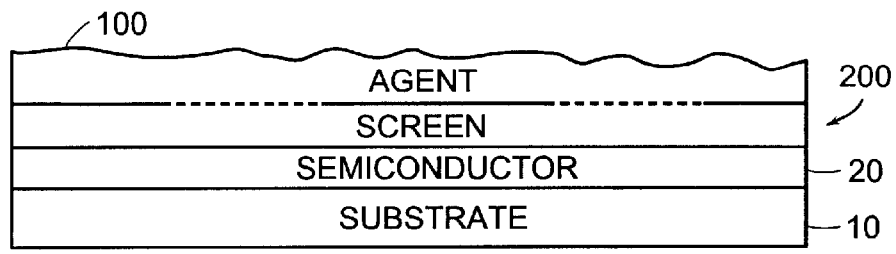
FIG. 2a shows a cross-sectional view of an electronic device at an intermediate stage of fabrication that employs screen printing of a destructive agent.
Figure 2B:
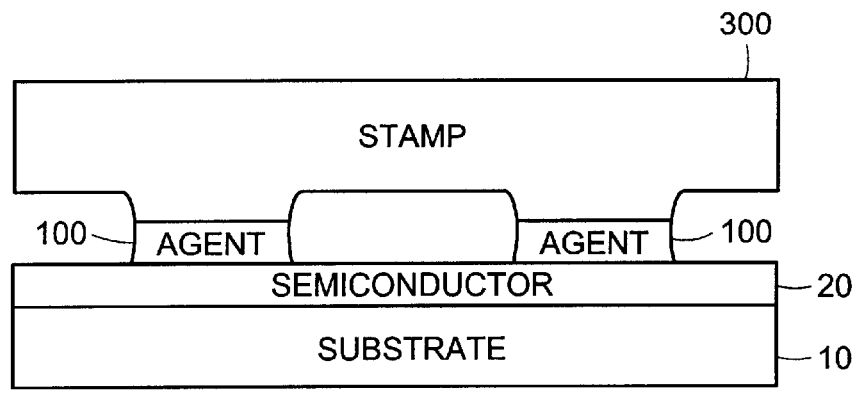
FIG. 2b shows a cross-sectional view of an electronic device at an intermediate stage of fabrication that employs stamping of a destructive agent.

Now referring to FIG. 2a and 2b, the destructive agent 100 can be deposited on the organic semiconductor film 20 via various methods. In some preferred embodiments, low cost methods are employed to deposit a patterned film of the destructive agent 100 onto the organic semiconductor film 20. Portions of the organic semiconductor film 20 that are in direct contact with the destructive agent 100 will have their properties damaged.

In one embodiment, a screen 200 is used for patterned deposition of the destructive agent on the organic semiconductor film 20. In another embodiment, a stamp 300 provides patterned deposition of the destructive agent 100. For example, pentacene precursor is soluble in dicholoromethane, when an rubber stamp wetted with dichloromethane is brought into contact with pentacene precursor, it partially dissolves the pentacene precursor, therefore, a patterned pentacene can be obtained upon thermal conversion. Other relatively low cost deposition methods can serve to deposit the destructive agent 100, for example, printing processes such as ink jet printing, electrostatic printing processes, and thermal printing.

To assist in the deposition process and control of the destructive agent 100, the destructive agent 100 can comprise a gelling agent. The rheological properties imparted by the gelling agent aid selective placement of, for example, a solvent. The gelling agent can comprise a soluble polymer or a substance that forms extended aggregates.

After a gel-based destructive agent 100 comprising a solvent dissolves neighboring portions of the organic semiconductor film 20, the solvent can then be allowed to dry at ambient temperature or with the application of heat or decreased pressure. The formerly dissolved portions of the organic semiconductor film 20 redeposits in combination with the gelling agent, leaving damaged material 22 with gross morphological changes, typically with no remaining semiconducting properties.

Gross changes in portions of the organic semiconductor 20 can be caused by other materials as the destructive agent 100. For example, chemical reactions through use of, for example, an oxidizing agent can cause portions of the organic semiconductor film 20 to convert to an insulator. Other destructive agents, for example electromagnetic radiation such as UV applied through a contact mask and e-beam applied without a mask, can convert exposed portions of the organic semiconductor film 20 into insulator.

In another embodiment, the destructive agent 100 can be deposited first, followed by deposit of the organic semiconductor film 20. For example, a patterned layer of poly (ethylene glycol) is deposited for use as the destructive agent 100. The layer is patterned either by spatially-specific deposition or by blanket deposition followed by removal of selected portions. The organic semiconducting film 20 is deposited adjacent to the patterned poly(ethylene glycol) destructive layer 100. Water is applied, the water dissolving the patterned poly(ethylene glycol) destructive layer 100, but not substantially damaging the organic semiconducting film 20. The portions of the organic semiconducting film 20 that were adjacent to the patterned poly(ethylene glycol) destructive layer 100 become physically detached from the substrate 10 during the dissolution of the poly(ethylene glycol) and are removed.

Figure 3:
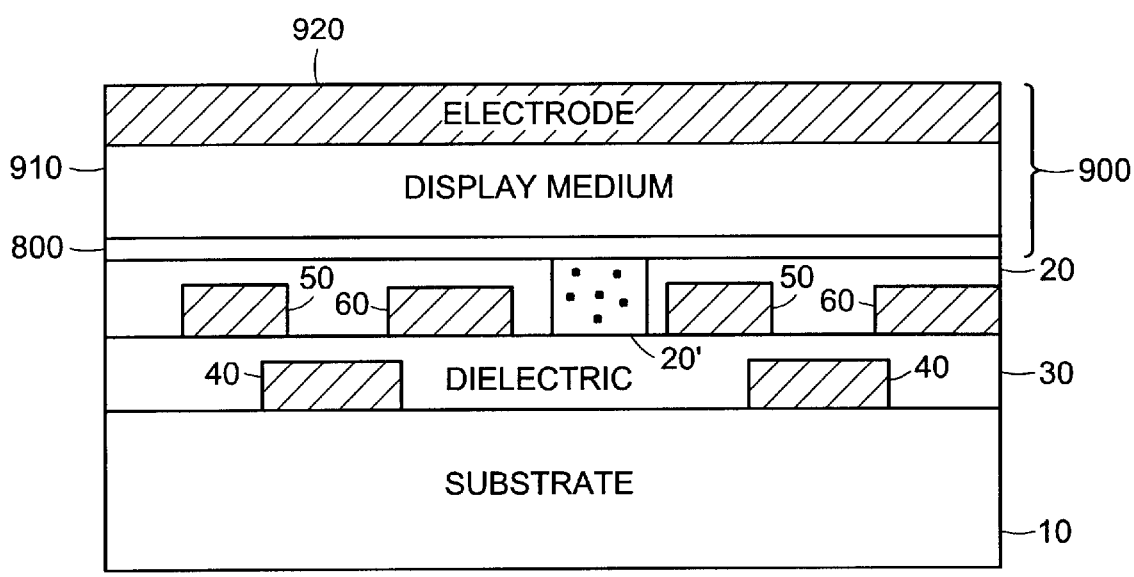
FIG. 3 shows a cross-sectional view of a display device that utilizes an TFT array fabricated with the process corresponding to the embodiment depicted in FIG. 1.

Fabrication of displays devices such as liquid crystal or electrophoretic displays, in particular microencapsulated electrophoretic displays, can utilize the above method during fabrication of arrays of OTFT's for addressing the display medium. Referring to FIG. 3, an embodiment of an electrophoretic display device comprises: a substrate 10, for example a silicon wafer; a gate electrode 40, for example, heavily doped silicon; a dielectric layer 30, for example, silicon dioxide; source 50 and drain 60 electrodes, for example gold; an organic semiconductor film 20, for example poly(alkylthiophene), pentacene, alpha-sexithiophene, or copper phthalocyanine ("CuPc"); an electrophoretic display medium assembly 900 comprising an electrophoretic display medium 910 and a top electrode 920; and a lamination adhesive 800, for example a water-based polyurethane emulsion, where the lamination adhesive is used to attach the display medium assembly 900 to the organic semiconductor film 20 and other portions of the OTFT. In particular, damaged material 21' in portions of the organic semiconductor film provide electrical isolation between individual transistors in the OTFT array.

In some embodiments, the array of OTFT's is first separately manufactured from the manufacture of the electrophoretic display medium assembly 900. The display medium assembly 900 is comprised, for example, of a microencapsulated electrophoretic display medium printed onto an indium tin oxide ("ITO") coated glass plate. The OTFT array is then bonded, in this embodiment, to the display medium assembly 900 with the lamination adhesive 800.

Patterning with Use of a Mask

Figure 4:
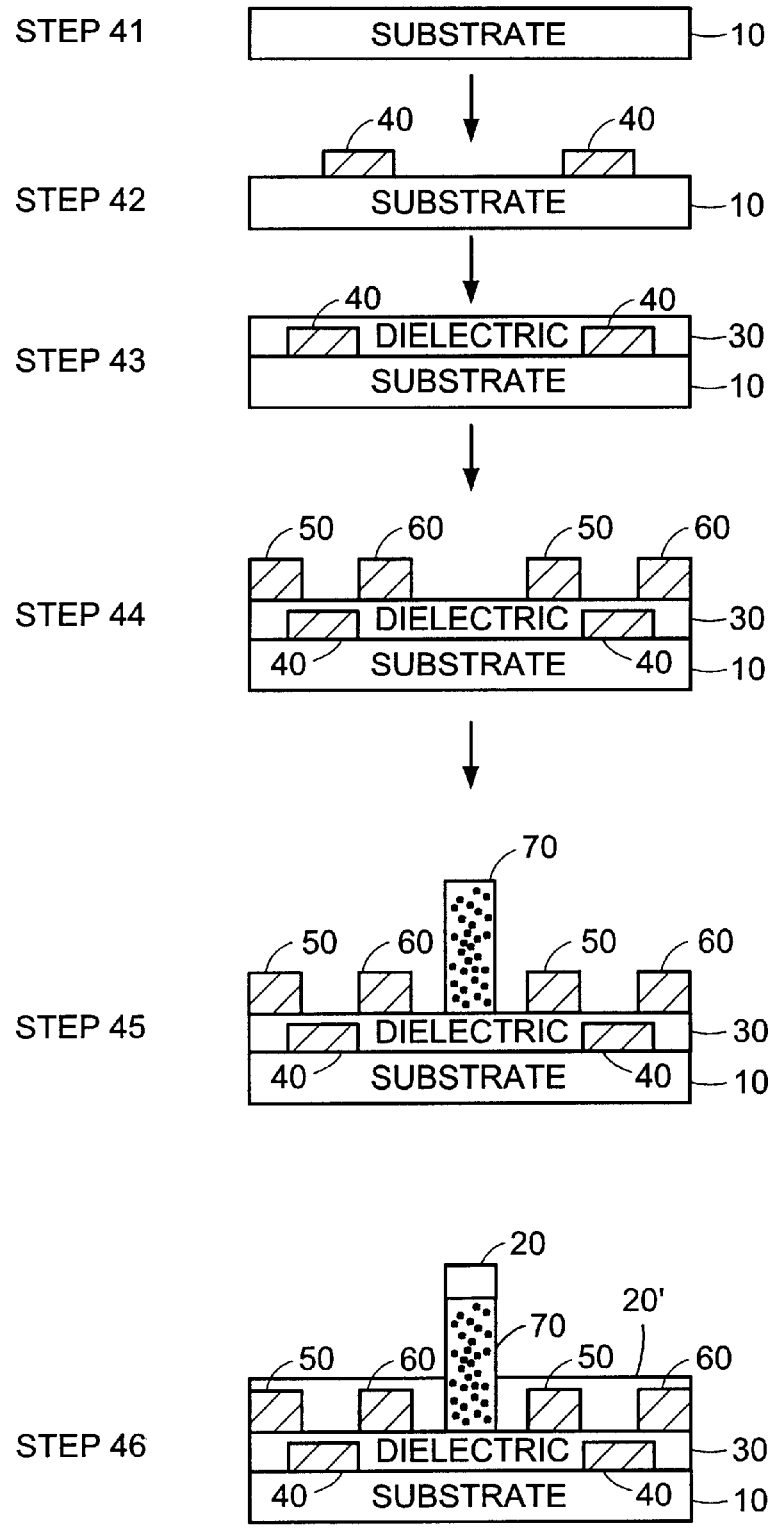
FIG. 4 shows cross-sectional views of an embodiment of a process for fabricating bottom contact TFT's.

Referring now to FIG. 4, a method for manufacturing a transistor utilizes a mask 70 to assist electrical isolation of neighboring transistors. In one embodiment, the transistor is part of an array of bottom contact transistors. That is, source and drain electrodes lie beneath the semiconductor layer. In one embodiment, the method begins with provision of a substrate 10 (Step 41). Next, the gate electrode 40 is provided on the substrate 10 (Step 42), followed by provision of the dielectric layer 30 (Step 43), preferably a gate dielectric. A source electrode 50 and a drain electrode 60 are deposited onto the dielectric layer 30, opposite to the gate electrode 40 (Step 44).

The mask layer 70 is deposited in a pattern such that the mask layer 70 resides in areas that lie between sites of individual transistors (Step 45). Provision of a semiconductor layer 20' then serves to coat the source and drain electrodes 50, 60, the dielectric layer 30 and the mask 70 (Step 46). Preferably, a thickness of the semiconductor layer 20' is less than a thickness of the mask 70. Preferably, the thickness of the semiconductor layer 20' is in a range of about 1/50 to 1/1000 of the thickness of the mask 70. This thickness disparity can serve to disrupt the continuity of the semiconductor layer 20' between neighboring transistors and make removal of the mask 70 optional. Generally, a bigger thickness disparity provides a better disruption.

Even if the continuity of the semiconductor layer 20' is not substantially disrupted by the mask 70, the mask 70 increases the effective physical separation between individual transistors. That is, there is a greater path length through the semiconductor layer 20' from one transistor to the next while passing over the mask 70 than would generally exist without use of the mask 70. The above described bottom contact process has the further advantage of sparing the vulnerable semiconductor layer 20' and its interfaces from a solvent used to remove the mask.

One example of a mask material is DuPont 5036 (E.I. du Pont de Nemours and Company, Wilmington, Del.) which is a solvent-based, screen-printable polymer ink. It can be removed by acetone or other solvents.

In some embodiments, relatively simply deposition of the semiconductor layer 20' is obtained by use of an organic semiconductor or a colloidal dispersion comprising a plurality of inorganic semiconducting particles. Solvent processable organic semiconductors like polyalkylthiophenes or vacuum evaporated semiconductors such as pentacene can be used. If a solution-cast organic semiconductor is used, the solvent used to remove the mask 70 must not be a substantial solvent for the organic semiconductor.

The semiconductor layer 20' in other embodiments comprises imperfect forms of silicon such as amorphous silicon or polysilicon. Such forms are typically obtained when silicon is grown other than directly on a perfect silicon substrate.

Figure 5:
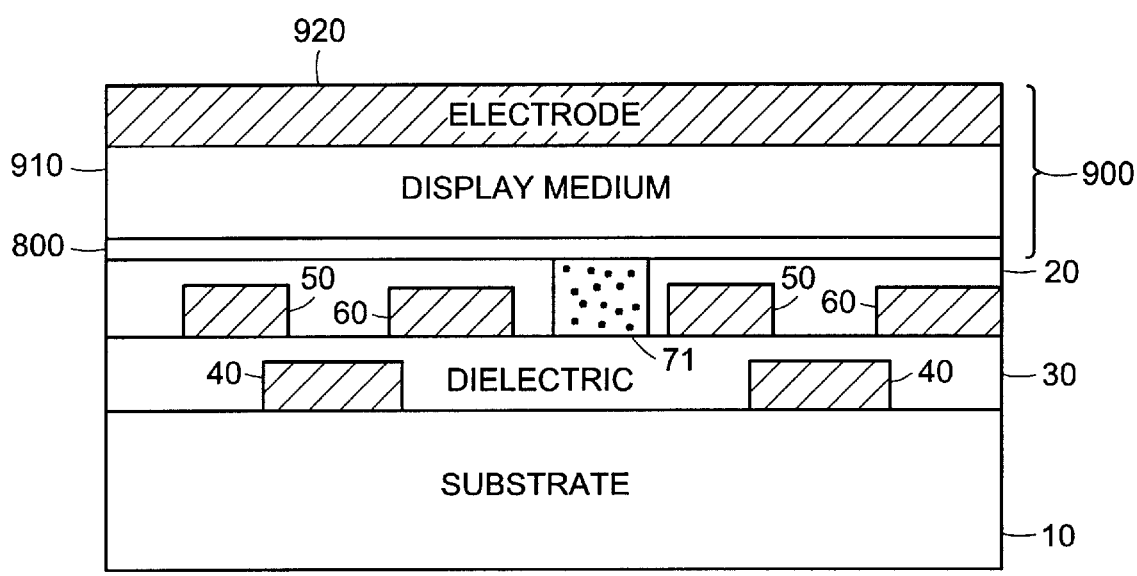
FIG. 5 shows a cross-sectional view of a display device that utilizes an TFT array fabricated with the process corresponding to the embodiment depicted in FIG. 4.

Now referring to FIG. 5, in some embodiments, arrays of transistors fabricated according to the above described processes are advantageously employed in display devices. In one embodiment, the display assembly 900 is laminated with use of the adhesive 800 to an array of transistors fabricated according to the method depicted in FIG. 4. Prior to lamination, the mask 70 can be partially or fully removed, leaving a portion of mask material or a void 71 in the completed display.

The display medium 910 in some embodiments comprises a liquid crystal or an electrophoretic display medium. Some preferred embodiments employ a microencapsulated electrophoretic display medium. Such a medium permits fabrication of an all-printed, large-area flexible display.

Figure 6:
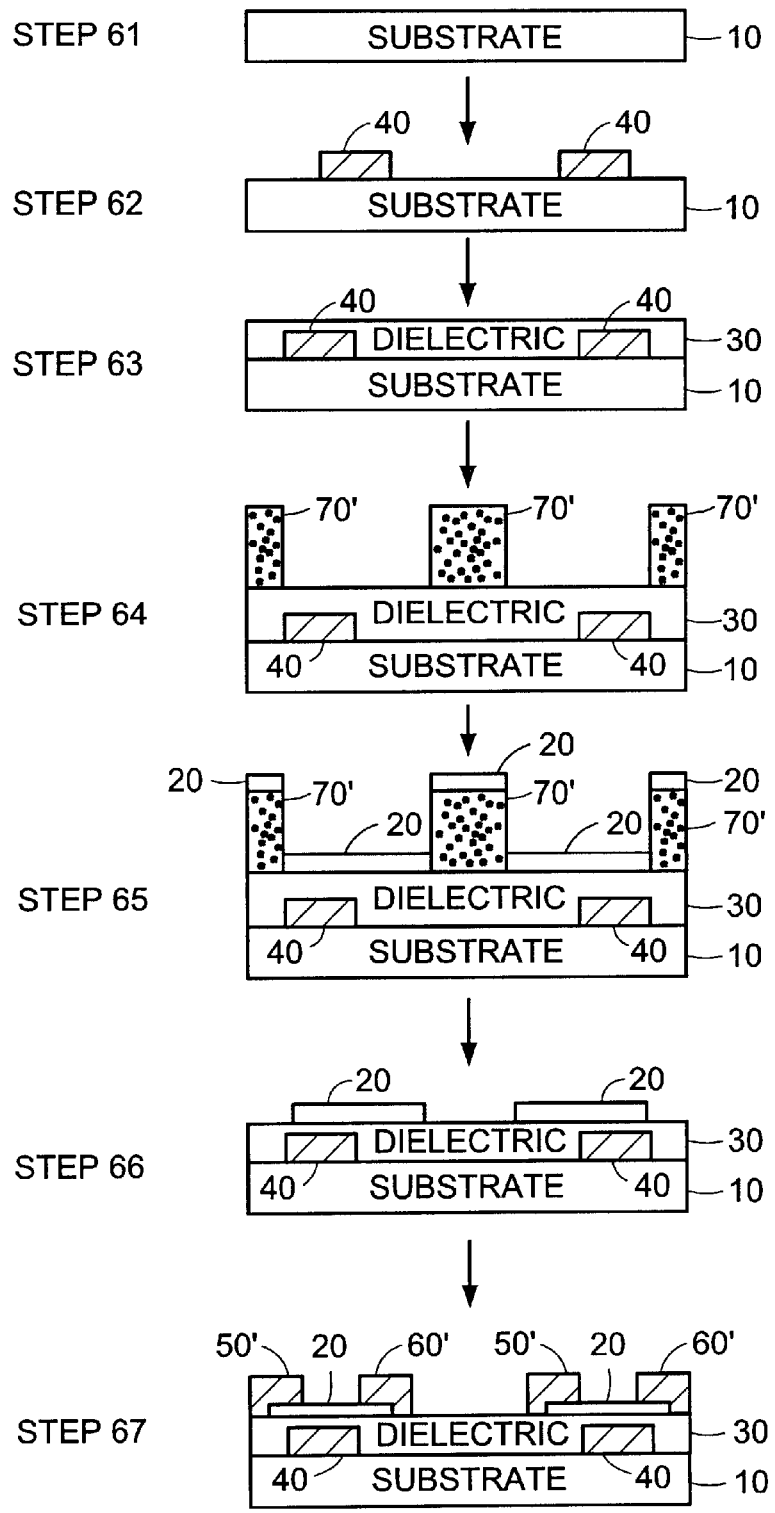
FIG. 6 shows cross-sectional views of an embodiment of a process for fabricating bottom contact TFT's.

Referring now to FIG. 6, an embodiment of a top contact process for fabricating a transistor or transistor array is described. The substrate 10 (Step 61) has one or more gate electrodes 40 deposited adjacent to it (Step 62). The gate dielectric 30 is deposited adjacent to the gate electrodes 40 and the substrate 10 (Step 63). A patterned mask 70' is then deposited on portions of the dielectric 30 to provide for electrical isolation of individual transistors (Step 64).

Next, a semiconductor layer 20 is deposited adjacent the mask 70' and the portions of exposed dielectric 30 (Step 65). After removal of the mask, a patterned semiconductor layer 20 is obtained (Step 66). Formation of source 50' and drain 60' electrodes completes fabrication of essential features of individual transistors (Step 67).

Various embodiments exist for the materials used and specific geometry of a transistor array. The semiconductor layer 20 comprises either an organic semiconductor or a plurality of colloidal particles. The semiconductor layer 20 is preferably formed with a thickness less than the thickness of the mask 70' to ease removal of the mask along with adjacent portions of the semiconductor layer 20.

The mask in some embodiments is formed through use of a solvent-based polymer. The solvent-based polymer can be deposited, for example, by a printing process followed by evaporation of the solvent. In another embodiment, a polymer is deposited and then cured to form the mask 70'.

Removal of some masks, for example those formed from a solvent-based polymer, can be removed with a solvent, for example acetone. In one embodiment, an organic semiconductor film is patterned by use of a mask 70' as a release layer and a solvent that dissolves the release layer without substantial effect on the organic semiconductor film.

All of the above methods can be advantageously employed in the formation of arrays of polymer-based thin-film transistors in the manufacture of electrophoretic displays. Such displays can take advantage of low cost deposition steps, such as printing of inks, and can be very flexible, in part though use of flexible, polymer substrates. Further descriptive detail concerning materials and methods utilized in the manufacture of electrophoretic displays is given in the following.

Method Of Manufacturing An Electrophoretic Display Assembly

In a preferred embodiment, an encapsulated electrophoretic display assembly is manufactured with use of printing or coating steps on a wide variety of flexible substrates. As used herein, the term "printing" includes all forms of printing and coating, including, but not limited to, pre-metered coatings such as patch die coating, slot or extrusion coating, slide or cascade coating, and curtain coating: roll coating such as knife over roll coating, forward and reverse roll coating, gravure coating, dip coating, spray coating, meniscus coating, spin coating, brush coating, air knife coating, silk screen printing processes, electrostatic printing processes, thermal printing processes, ink jet printing processes and other similar techniques. Thus, the resulting display can be flexible. Further, because the display medium can be printed (using a variety of methods), the display itself can be made inexpensively.

Further, printing methods can be used to form the electrical connections and other conductive portions of a display. A rear conductor ("rear" referring to a side of a display that is opposite to that viewed by a user) can be ether opaque or transparent. This allows the use of a variety of printed rear conductors, including graphite inks, silver inks, or conductive polymers.

The front conductor ("front" referring to a side of a display that is viewed by a user) must be transparent, but need not have excellent conductivity. Even materials with relatively poor conductivity, though amenable to printing, can be employed, for example conductive colloidal suspensions and conductive polymers such as are commonly used in anti-static applications.

A microencapsulated electrophoretic medium, unlike a liquid crystal medium, is amenable to use with a wide number of intrinsically conductive polymer systems, including derivatives of polyaniline, polypyrrole, polythiophene, and polyphenylenevinylene.

In short, the present invention permits a more advantageous use of cost savings allowed by use of printing methods for formation of conducting materials in a display assembly.

The following describes in detail various embodiments of materials with applications to the electrophoretic display medium.

Materials for Use in Electroiphoretic Displays

Useful materials for constructing the above-described encapsulated electrophoretic displays are discussed in detail below. Many of these materials will be known to those skilled in the art of constructing conventional electrophoretic displays, or those skilled in the art of microencapsulation.

A. Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E. I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415 B), Oil Black BG (DuPont) (Solv. Black 16), Rotalin Black RM (DuPont), Sevron Brilliant Red 3 B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 pm), Statex B-12 (Columbian Carbon Co.) (a furnace black of 33 $\mu$m average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 $\mu$m, as long as the particles are smaller than the bounding capsule. In a preferred embodiment, the density of the electrophoretic particle may be substantially matched to that of the suspending (i. e., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins-DuPont, Primacor Resins-Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 $\mu$m. It is then dispersed in a carrier liquid, for example ISOPAR™ (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® ( series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytoxo from DuPont (Wilmington, Del.). In a preferred embodiment, the suspending fluid is a poly (chlorotrifluoroethylene) polymer. In a particularly preferred embodiment, this polymer has a degree of polymerization from about 2 to about 10. Many of the materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyne-4,7-diol, poly(propylene glycol), pentaethylene glycol, tripropylene glycol, triethylene glycol, glycerol, pentaerythritol, glycerol tris(12-hydroxystearate), propylene glycerol monohydroxystearate, and ethylene glycol monohydroxystearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol,5-amino-1-pentanol, and tetrakis(2-hydroxyethyl)ethylene-diamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain (C12 to C50) alkyl and alkyl benzene sulphonic acids, fatty amines or diarnines and their salts or quartemary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe- salts of naphthenic acid, Ba-, Al-, Zn-, Cu-, Pb-, and Fe- salts of stearic acid, divalent and trivalent metal carboxylates, such as aluminum tristearate, aluminum octanoate, lithium heptanoate, iron stearate, iron distearate, barium stearate, chromium stearate, magnesium octanoate, calcium stearate, iron naphthenate, and zinc naphthenate, Mn- and Zn- heptanoate, and Ba-, Al-, Co-, Mn-, and Zn- octanoate. Useful block or comb copolymers include, but are not limited to, AB diblock copolymers of (A) polymers of 2-(N,N)-dimethylaminoethyl methacrylate quatemized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 371 and 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

There is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications,* (I. E. Vandegaer, ed.), Plenum Press, New York, N.Y. (1974) and Gutcho, *Microcapsules and Mircroencapsulation Techniques,* Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly- amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. No. 4,001,140 and U.S. Pat. No. 4,273,672 patents are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrolidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×g, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the waterborne system, with the obvious exception of the water itself. The latitude in formulation for solvent systems is enormous, limited only by solvent choices and polymer solubility. Of considerable concern in solvent-based systems is the viability of the capsule itself the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A process for forming a pattern in a semiconductor film comprising the steps of:
    a) providing a substrate;
    b) providing an organic semiconductor film adjacent the substrate; and
    c) providing a destructive agent adjacent selected portions of the organic semiconductor film, the destructive agent changing a property of the selected portions of the organic semiconductor film such that the property of the selected portions of the organic semiconductor film differs from the property of a remaining portion of the organic semiconductor film, wherein the property of the selected portions is changed substantially through the full thickness of the organic semiconductor film.

2. The process of claim 1 further comprising the step of d) providing at least one of a conductive element and an insulative element to provide a circuit.

3. The process of claim 1 wherein the destructive agent changes an electrical property of selected portions of the organic semiconductor film.

4. The process of claim 1 wherein step c) comprises dissolution of the selected portions of the organic semiconductor film.

5. The process of claim 4 wherein the destructive agent comprises a solvent.

6. The process of claim 5 wherein the destructive agent comprises a solvent and a gelling agent.

7. The process of claim 5 further comprising the step of d) evaporating the solvent after dissolving the organic semiconductor film.

8. The process of claim 1 wherein step c) comprises providing the destructive agent through a printing process.

9. The process of claim 8 wherein step c) comprises providing the destructive agent through a screen printing process.

10. The process of claim 1 wherein step c) comprises providing the destructive agent through a stamping process.

11. The process of claim 1 wherein the organic semiconductor layer comprises poly(alkyl thiophene) and the destructive agent comprises one of chloroform, toluene, and xylene.

12. A method for manufacturing a transistor comprising the steps of:
    a) providing a substrate;
    b) providing a gate electrode adjacent the substrate;
    c) providing a gate dielectric adjacent the substrate and the gate electrode;
    d) providing a source electrode and a drain electrode adjacent the gate dielectric;
    e) providing a mask adjacent the gate dielectric in a pattern such that the source electrode, the drain electrode, and a portion of the gate dielectric remain exposed; and f) providing a semiconductor layer comprising one of an organic semiconductor and a plurality of inorganic colloidal particles, adjacent the source electrode, the drain electrode, the portion of the gate dielectric and the mask, thereby forming the transistor, the semiconductor layer having a thickness less than a thickness of the mask.

13. The method of claim 12 wherein step f) comprises printing the mask by f1) providing a solvent-based polymer adjacent the gate dielectric and f2) evaporating the solvent.

14. The method of claim 12 further comprising providing an electronic display medium comprising a plurality of microcapsules, each capsule comprising one of electrophoretic particles, suspended particles and bichromal sphere, and providing the semiconductor layer near the display medium for addressing the display medium.

15. The method of claim 12 further comprising providing a liquid crystal display medium and providing the semiconductor layer near the display medium for addressing the display medium.

16. The method of claim 12 wherein step f) comprises f1) printing a mask comprising polymer adjacent the gate dielectric and f2) curing the polymer.

17. The method of claim 12 wherein step g) comprises providing a semiconductor layer having a thickness of 1/50 to 1/1000 of a thickness of the mask.

18. A method for manufacturing a transistor comprising the steps of:
    a) providing a substrate;
    b) providing a gate electrode adjacent the substrate;
    c) providing a gate dielectric adjacent the gate electrode and the substrate;
    d) printing a mask adjacent the gate dielectric in a pattern such that a portion of gate dielectric remains exposed;
    e) providing a semiconductor layer comprising one of an organic semiconductor and a plurality of inorganic colloidal particles, adjacent the mask and the portion of the gate dielectric, the semiconductor layer having a thickness less than a thickness of the mask;
    f) removing the mask; and
    g) forming a source electrode and a drain electrode adjacent the semiconductor layer and the gate dielectric, thereby forming the transistor.

19. The method of claim 18 further comprising providing an electronic display medium comprising a plurality of microcapsules, each capsule comprising one of electrophoretic particles, suspended particles and bichromal sphere, and providing the semiconductor layer near the display medium for addressing the display medium.

20. The method of claim 18 further comprising providing a liquid crystal display medium and providing the semiconductor layer near the display medium for addressing the display medium.

21. The method of claim 18 wherein step d) comprises printing the mask by d1) providing a solvent-based polymer adjacent the gate dielectric and d2) evaporating the solvent.

22. The method of claim 18 wherein step d) comprises d1) printing the mask comprising a polymer adjacent the gate dielectric and d2) curing the polymer.

23. The method of claim 18 wherein step f) comprises removing the mask using a solvent.

24. The method of claim 23 wherein the solvent comprises acetone.

25. The method of claim 18 wherein step e) comprises providing a semiconductor layer having a thickness of about 1/50 to 1/1000 of a thickness of the mask.

26. A process for forming a pattern in a semiconductor film comprising the steps of:
    a) providing a substrate;
    b) providing a release layer adjacent selected portions of the substrate;
    c) providing an organic semiconductor film adjacent the release layer and the substrate; and
    d) exposing the release layer to a solvent which dissolves the release layer without dissolving the organic semiconductor film, thereby removing the release layer and the organic semiconductor film adjacent the release layer without removing the organic semiconductor film adjacent the substrate.

* * * * *